United States Patent [19]

Hasegawa et al.

[11] 4,252,576
[45] Feb. 24, 1981

[54] EPITAXIAL WAFER FOR USE IN PRODUCTION OF LIGHT EMITTING DIODE

[75] Inventors: Shinichi Hasegawa; Hisanori Fujita, both of Tscuhiura, Japan

[73] Assignee: Mitsubishi Monsanto Chemical Co., Tokyo, Japan

[21] Appl. No.: 55,377

[22] Filed: Jul. 6, 1979

[30] Foreign Application Priority Data

Jul. 7, 1978 [JP] Japan .................................. 53/82739

[51] Int. Cl.³ ...................... H01L 29/12; H01L 21/20
[52] U.S. Cl. ................................. 148/33.4; 29/569 L; 148/33; 148/33.5; 148/175; 357/16; 357/17; 357/63
[58] Field of Search ................ 148/175, 186, 33, 33.4, 148/33.5; 29/569 L; 252/62.3 GA; 357/16–18, 63

[56] References Cited

U.S. PATENT DOCUMENTS

| 3,617,820 | 11/1971 | Herzog | 148/186 X |
| 3,687,744 | 8/1972 | Ogirima et al. | 148/175 |
| 3,745,423 | 7/1973 | Kasano | 357/17 X |
| 3,873,382 | 3/1975 | Groves et al. | 148/175 |
| 4,001,056 | 1/1977 | Groves et al. | 148/175 |
| 4,154,630 | 5/1979 | Diguet et al. | 148/175 |

OTHER PUBLICATIONS

Herzog et al., "Electroluminescence . . . GaAeP . . . Low Donor Concentration" J. Applied Phys., vol. 40, No. 4, Mar. 1969, pp. 1830–1838.
Dierschke et al., "Effect of Donor Concentration . . . GaP . . ."
Ibid, vol. 41, No. 1, Jan. 1970, pp. 321–328.
Blakeslee et al., "Reducing Resistance in . . . GaAeP" I.B.M. Tech. Discl. Bull., vol. 15, No. 4, Sep. 1972, p. 1284.
Stewart, C. E., "Some Observations . . . GaAeP Epitaxial Layers" J. Crystal Growth, vol. 8, 1971, pp. 269–275.

*Primary Examiner*—R. Dean
*Assistant Examiner*—W. G. Saba
*Attorney, Agent, or Firm*—Burgess, Ryan and Wayne

[57] ABSTRACT

An epitaxial wafer of $GaAs_{1-x}P_x$ has been doped with nitrogen and used for the production of light emitting diode (LED). The carrier concentration of the conventional $GaAs_{1-x}P_x$ was from $3\times10^{16}$ to $2\times10^{17}/cm^3$.

According to the present invention, the carrier concentration is reduced lower than the conventional concentration and the luminance of LED is increased approximately two or three times the conventional luminance.

8 Claims, No Drawings

EPITAXIAL WAFER FOR USE IN PRODUCTION OF LIGHT EMITTING DIODE

BACKGROUND OF THE INVENTION

The present invention relates to an epitaxial wafer of gallium arsenide phosphide for use in the production of a light emitting diode.

A gallium arsenide phosphide ($GaAs_{1-x}P_x$) having a mixed crystal ratio "x" ranging from 0.5 to 1 has conventionally been epitaxially grown on a semiconductor substrate and doped with nitrogen for generating an iso-electronic trap. A PN junction is subsequently produced in the epitaxial layer, thereby producing the light emitting diode, hereinafter referred to as LED, which emits red, orange, yellow, green or similar lights, having an emission peak wavelength of from 550 nm to 650 nm.

The carrier concentration in the epitaxial layer of the gallium arsenide phosphide mixed crystal, in which layer the PN junction is formed, has been in the range of from $3 \times 10^{16}$ to $2 \times 10^{17}/cm^3$. A carrier concentration of from $9 \times 10^{15}$ to $3 \times 10^{17}/cm^3$ is stated in the Japanese Laid Open Patent Applications Nos. 53-64488 and 53-66388. Since the LED having the carrier concentration mentioned above exhibits a low luminance, a relatively high electric power has been necessary to increase the luminance. There has been a demand to develop a low electric power and high luminance LED to be used in an indicating device containing CMOS LSI, which has recently been broadly used. The electric power consumed in the LED should be low in accordance with the low electric power consumption in the CMOS LSI.

SUMMARY OF THE INVENTION

It is an object of the present invention to provide an epitaxial wafer of a gallium arsenide phosphide mixed crystal or gallium phosphide suitable for the production of a high luminance LED.

It is another object of the present invention to provide an epitaxial wafer suitable for the production of LED, which exhibits a higher luminance value per current density applied to a LED than such value of the conventional LED, which thus can be conveniently utilized in industry.

The inventive concept conceived by the Inventors involves decreasing the carrier concentration of a nitrogen-doped epitaxial layer of a gallium arsenide phosphide mixed crystal, in which the mixed crystal mixing ratio is from 0.5 to 1.0, to a level lower than the lower limit of the carrier concentration range which has been conventionally used. The Inventors discovered that the generation of crystal defects in the epitaxial layer of the mixed phase can be suppressed due to the low carrier concentration, with the result that the luminance of the LED is enhanced.

In an epitaxial wafer for use in the production of a light emitting diode, comprising:

a single crystalline semiconductor substrate, and;

an epitaxial layer of a compound semiconductor being doped with nitrogen and having a general formula of $GaAs_{1-x}P_x$, wherein the mixed crystal ratio x ranges from 0.5 to 1.0, the applicant's improvement comprises providing said epitaxial layer with a concentration of carriers having one conductivity type in the range of from $3.5 \times 10^{15}$ to $8.8 \times 10^{15}/cm^3$.

DESCRIPTION OF THE PREFERRED EMBODIMENTS

The object mentioned above and other objects of the present invention are achieved by adjusting the carrier concentration of a nitrogen-doped, epitaxial active layer of the gallium arsenide phosphide mixed crystal or gallium phosphide ($GaAs_{1-x}P_x$, $0.5 \leq x \leq 1$) from $3.5 \times 10^{15}$ to $8.8 \times 10^{15}$ atoms/$cm^3$, preferably from $5 \times 10^{15}$ to $8.6 \times 10^{15}$ atoms/$cm^3$.

The single crystalline substrate may consist of a semiconductor material selected from the group of an element semiconductor of group IV and a compound semiconductor from groups III and V of the periodic table. The compound semiconductor single crystal is cut or sliced from an ingot of gallium arsenide, gallium phosphide and the like, preferably gallium phosphide. The surface of the compound semiconductor substrate should have an orientation of (100) plane with or without a so-called off angle, namely an angle of less than 5° with respect to the (100) plane. The group IV element semiconductor, which can be used in addition to the compound semiconductor for the substrate, may be silicon, germanium and the like. Since substrates of silicon and germanium having a large area are available at a low cost, it is possible to produce the LED at a low cost. A layer or layers of gallium arsenide phosphide or gallium phosphide is epitaxially grown on the surface of the single crystalline substrate. The mixed crystal ratio, namely the value x of the formula $GaAs_{1-x}P_x$, is selected within the range from 0.5 to 1.0 depending upon the emission wave length of the LED. Since the gallium phosphide and gallium arsenide phosphide having the mixed crystal ratio mentioned above is an indirect transition type, nitrogens have conventionally been doped into the gallium phosphide and gallium arsenide phosphide so as to enhance the emission efficiency due to the iso-electronic trap by the doped nitrogens. The nitrogens, which do not act as carriers, are doped in an amount of from mid.-$10^8$ to low-$10^{19}/cm^3$ in the wafer of the present invention. The designation "mid." and "low" indicate middle value and low value in the range from 1 to 9, respectively. The epitaxial layer mentioned above usually has a thickness of from 5 to 50 microns. Since an ohmic contact is provided on the side of the single crystalline semiconductor substrate opposite to the side thereof on which the epitaxial layer is grown, the substrate usually has a high carrier concentration in the range of from low-$10^{17}$ to low-$10^{18}/cm^3$.

It is desirable to provide an intermediate epitaxial layer between the single crystalline semiconductor substrate and the epitaxial layer mentioned above, when the substrate and the epitaxial layer used as an active layer of LED have a lattice constant different from one another. The intermediate epitaxial layer has a composition of the formula $GaAs_{1-y}P_y$ and is placed between the single crystalline semiconductor substrate having a lattice constant hereinafter designated as $l_1$ and the epitaxial layer of a compound semiconductor $GaAs_{1-x}P_x$ having a lattice constant of $l_2$. The lattice constant of the compound semiconductor $GaAs_{1-y}P_y$ is gradually changed in said intermediate layer within the range of from approximately $l_1$ to approximately $l_2$. The intermediate layer usually has thickness of from 5 to 50 microns.

The intermediate layer is used as a coherent layer for matching the different lattice constants of $l_1$ and $l_2$; for example, the single crystalline gallium phosphide substrate and the gallium arsenide phosphide of formula $GaAs_{1-x}P_x(0.5 \leq x < 1)$. In the compound $GaAs_{1-y}P_y$, the mixed crystal ratio y continuously varies from 1 to a predetermined desired value, usually the same value as that of the epitaxial layer. The constant layer, epitaxially grown on the substrate, has the same type of conductivity as that of the substrate, and may have a carrier concentration of from $2 \times 10^{16}$ to $5 \times 10^{17}/cm^3$. As the intermediate costant layer, it is possible to use the epitaxial layer disclosed by the present Inventors in the Japanese Patent Application No. 51-140443 (Japanese Laid Open Patent Application No. 53-64488) and having the following distribution of carrier concentration. The carrier concentration of the lower part of the disclosed epitaxial layer is almost the same as that of the substrate; for example, $1 \times 10^{17}/cm^3$ or more. The carrier concentration of the upper part thereof is low and is in the range of from $1 \times 10^{16}$ to $2 \times 10^{17}/cm^3$.

The epitaxial layer of gallium arsenide phosphide or gallium phosphide, which layer is grown directly on the semiconductor substrate or on the coherent layer, contains carriers, i.e., electrons, at a lower concentration than the carrier concentration which has conventionally been adopted for the N type active layer of LED. As a result of the low carrier concentration, the luminance of LED is furthermore improved by the forming of an iso-electronic trap in the active layer of the LED. By doping P-type impurities, for example zinc atoms, into an upper part of the N-type active layer, a light emitting PN junction is produced. The carrier concentration of the P-type layer should be from mid.-$10^{17}$ to low-$10^{20}/cm^3$, preferably from low-$10^{18}$ to low-$10^{19}/cm^3$. It is possible to produce an epitaxial wafer suitable for use in the production of LED exhibiting a high luminance and a high emission efficiency, by means of reducing the carrier concentration in the N-type layer which is used in the PN junction. The carrier or hole concentration of the P-type layer is not specifically limited, although preferably falls within the range mentioned above.

The epitaxial layers mentioned above may be produced by a liquid phase process, but are preferably produced by a gas phase growth. In order to carry out the gas phase growth at a low carrier concentration, a carrier gas used for carrying the components of the gas phase growth may contain for example, sulfur as the dopant in a concentration of for example, from 5 to 200 ppm, and which has a flow rate which has been selected relative to the flow rates of the components of the gas phase growth of the compound semiconductor.

The present invention will be explained in further detail by reference to the Examples and the Control Examples, wherein all percentages and ppm are by volume.

EXAMPLE 1

A horizontal reaction vessel for an epitaxial growth, hereinafter simply referred to as a reaction vessel, had an inner diameter of 70 mm and a length of 100 cm, and was made of quartz. A single crystalline semiconductor substrate, hereinafter simply referred to as a substrate, consisted of an N-type gallium phosphide and had a thickness of 290 microns. The substrate contained carriers at the concentration of $7.5 \times 10^{17}/cm^3$ due to sulfur doping. Strains, which generated in the substrate during the shaping of a gallium phosphide ingot into the substrate, were removed by mechanical polishing and chemical polishing. The substrate orientation was at a 5° off angle from the (100) plane to <110> direction. The substrate, as explained above was then positioned in the reaction vessel.

A quartz boat containing a highly purified metallic gallium (Ga) was placed in the reaction vessel. The air in the reaction vessel was then replaced by argon (Ar) and thereafter a hydrogen carrier gas was introduced, instead of the argon, into the reaction vessel at a rate of 2000 ml/minute. The portion of the reaction vessel, in which the quartz boat containing the metallic gallium was positioned, was heated by an electric furnace to a temperature of 750° C. The reaction vessel portion, in which the substrate was placed, was heated to a temperature of 850° C.

After the time when the reaction vessel was elevated to the temperatures above, nitrogen gas, a high purity hydrogen chloride (HCl) and hydrogen gas were introduced into the reaction vessel. The nitrogen gas contained 20 ppm of hydrogen sulfide and was introduced at a rate of 40 ml/minute. A high purity hydrogen chloride was introduced at a rate of 30 ml/minute, so as to convey the gallium vapor toward the substrate. The hydrogen gas contained 12% of phosphine ($PH_3$) and was introduced at a rate of 200 ml/minute. While the gases were introduced into the reaction vessel, the gallium phosphide layer was grown on the substrate over a period of 25 minutes. This layer had a thickness of 9 microns and a carrier concentration of $5.8 \times 10^{16}/cm^3$.

Subsequently, the flow rate of the hydrogen containing phosphine was reduced from 200 ml/minute to 150 ml/minute and a hydrogen gas containing 12% arsine was introduced into the reaction vessel at a rate which increased to 40 ml/minute over a period of 130 minutes, thereby producing an epitaxial layer having a mixed crystal ratio, which continuously varied from 1 to $0.74 \pm 0.08$. After the crystal ratio reached approximately 0.74, the flow rates of the components being introduced into the reaction vessel were constantly maintained over a period of 150 minutes, thereby producing an epitaxial layer having a constant mixed crystal ratio and a thickness of 30 microns.

Thereafter, ammonia ($NH_3$) was introduced at a rate of 200 ml/minute and the flow rate of the nitrogen gas containing 20 ppm of hydrogen sulfide was reduced to 9 ml/minute, while the flow rates of the other components were not changed. Under this condition an epitaxial growth was carried out over a period of 60 minutes, thereby forming an epitaxial active layer, in which an active layer of LED was to be produced. The epitaxial active layer had a concentration of carriers or electrons of $8.5 \times 10^{15}/cm^3$, a mixed crystal ratio of $0.74 \pm 0.08$ and a thickness of 18 microns.

Phosphous and zinc were diffused from a zinc phosphide ($ZnP_2$) into the gallium arsenide phosphide epitaxial layer having a mixed crystal ratio of $0.74 \pm 0.08$, thereby forming a PN junction and thus LED. An LED device was fabricated by applying a pair of aluminum electrodes on both sides of LED.

The peak emission wavelength was 610 nm and the LED therefore emitted a yellowish orange light. The luminance of the LED which was measured under the conditions of 20 $A/cm^2$ of current density and without the application of an epoxy resin coating, was 9650 Ft·L.

EXAMPLE 2

The procedure of Example 1 was repeated, except that the flow rate of the nitrogen containing a hydrogen sulfide was changed, thereby changing the carrier concentration of the active layer as shown in Table 1.

TABLE 1

| Run No. | Flow Rate of Dopant (ml/minute) | Carrier Concentration (per cm³) | Luminance (Ft. . L) |
|---|---|---|---|
| 1 | 9 | $8.5 \times 10^{15}$ | 9650 |
| 2 | 2 | $4.1 \times 10^{15}$ | 6410 |
| 3 | 4 | $5.2 \times 10^{15}$ | 8210 |
| 4 | 9.5 | $8.3 \times 10^{15}$ | 9400 |
| 5(control) | 2.0 | $2.2 \times 10^{16}$ | 3610 |
| 6(control) | 90 | $1 \times 10^{17}$ | 3610 |

Note:
1 Dopant indicates nitrogen gas, which contained 20 ppm of hydrogen sulfide.
2 Carrier concentration is the concentration of electrons in an N-type active layer.

The wafer produced comprised a gallium arsenide phosphide mixed crystal epitaxial layer which had a mixed crystal ratio of 0.74±0.08.

The luminance of the LED was measured under the same condition as in Example 1. The emission peak wavelength was 610±10 nm. As is apparent from Table 1, the luminance per current density is from approximately 320 to 483 Ft·L/A/cm² according to the carrier concentration of the present invention and is only 180 Ft·L/A/cm² in the control data (Run No. 5). From the comparison of Run Nos. 4 and 5, it will be understood that between the carrier concentrations of $10^{16}$ and $10^{15}$/cm³ there exists a carrier concentration value, which enhances the luminance in an amount as high as three times the luminance at high carrier concentration.

EXAMPLE 3

The procedure of Example 1 was repeated, except that during the growth of the layer having a constant mixed crystal ratio the flow rate of the hydrogen gas, which contained 12% of phosphine, was changed from 150 to 170 ml/minute, and further, the flow rate of the hydrogen gas, which contained 12% of arsine, was changed from 40 to 20 ml/minute. As a result of this growth, the grown gallium arsenide phosphide epitaxial layer had the mixed crystal ratio of 0.88±0.08. Subsequently to the growth of this $GaAs_{0.04-0.20}P_{0.80-0.96}$ layer, the flow rate of the nitrogen gas, which contained 20 ppm of hydrogen sulfide, was adjusted to 9 ml/minute, thereby forming an N type active layer, which contained carriers, i.e., electrons, at a concentration of $8.5 \times 10^{15}$/cm³.

The fabrication and the luminance measurement of the LED device were performed in the same manner as in Example 1. The wave length of peak emission was 585 nm and the luminance was 7500 Ft·L.

EXAMPLE 4

The flow rate of the nitrogen gas containing a hydrogen sulfide was changed from that of Example 3, and was varied as shown in Run Nos. 8 through 12, of Table 2, for the production of the active layer. The carrier concentration was, therefore, changed as shown in Table 2.

TABLE 2

| Run No. | Flow Rate of Dopant (ml/minute) | Carrier Concentration (per cm³) | Luminance (Ft · L) |
|---|---|---|---|
| 7 | 9 | $8.5 \times 10^{15}$ | 7500 |
| 8 | 2 | $4.0 \times 10^{15}$ | 5600 |
| 9 | 4 | $5.1 \times 10^{15}$ | 6720 |
| 10 | 9.5 | $8.8 \times 10^{15}$ | 7160 |
| 11(control) | 20 | $2.2 \times 10^{16}$ | 3200 |
| 12(control) | 50 | $7 \times 10^{16}$ | 3200 |

Note
(1) See Note (1) below Table 1.
(2) See Note (2) below Table 1.

Run No. 7 illustrates the results of Example 2.
The wavelength of emission peak was 585±15 nm. The luminance was measured under the conditions of a current density of 20 A/cm² and without the epoxy resin coating.

What we claim is:
1. In an epitaxial wafer for use in the production of a light emitting diode, comprising:
   a single crystalline semiconductor substrate, and;
   an epitaxial layer of a compound semiconductor being doped with nitrogen and having a general formula of $GaAs_{1-x}P_x$, wherein the mixed crystal ratio x ranges from 0.5 to 1.0, an improvement comprising providing said epitaxial layer with a concentration of carriers having one conductivity type in the range of from $3.5 \times 10^{15}$ to $8.8 \times 10^{15}$/cm³.
2. An epitaxial wafer according to claim 1, wherein said carrier concentration is from $5 \times 10^{15}$ to $8.6 \times 10^{15}$/cm³.
3. An epitaxial wafer according to claim 1 or 2, wherein said single crystalline semiconductor substrate consists of a gallium phosphide.
4. An epitaxial wafer according to claim 1 or 2, wherein said single crystalline semiconductor substrate consists of a gallium arsenide.
5. An epitaxial wafer according to claim 1 or 2, wherein said single crystalline semiconductor substrate consists of silicon.
6. An epitaxial wafer according to claim 1 or 2, wherein said wafer further comprises an intermediate epitaxial layer of a compound semiconductor having a formula $GaAs_{1-y}P_y$ between said single crystalline semiconductor substrate having a lattice constant hereinafter designated as $l_1$ and said epitaxial layer of a compound semiconductor $GaAs_{1-x}P_x$ having a lattice constant $l_2$, wherein the lattice constant of said compound semiconductor $GaAs_{1-y}P_y$ is gradually changed in said intermediate layer within the range of from approximately $l_1$ and approximately $l_2$.
7. An epitaxial layer according to claim 6, wherein the concentration of carriers having said one conductivity type in said epitaxial intermediate layer is from $2 \times 10^{16}$ to $5 \times 10^{17}$/cm³.
8. An epitaxial wafer according to claim 1 or 2, wherein said carriers having one conductivity type are electrons and said epitaxial layer of the compound semiconductor $GaAs_{1-x}P_x$ consists of an N type conductivity portion having said carrier concentration and a P type conductivity portion, these portions forming a light-emitting PN junction.

* * * * *

UNITED STATES PATENT AND TRADEMARK OFFICE
CERTIFICATE OF CORRECTION

PATENT NO. : B1 4,252,576

DATED : Jan. 3, 1989

INVENTOR(S) : Shinichi Hasegawa, et al.

It is certified that error appears in the above-identified patent and that said Letters Patent is hereby corrected as shown below:

<u>COLUMN 2</u>

Line 11, "of [of] from" should read --<u>from</u>--.

Signed and Sealed this

Fifth Day of September, 1989

Attest:

DONALD J. QUIGG

Attesting Officer

Commissioner of Patents and Trademarks ing.

REEXAMINATION CERTIFICATE (980th)
United States Patent [19]
Hasegawa et al.

[11] B1 4,252,576
[45] Certificate Issued  Jan. 3, 1989

[54] EPITAXIAL WAFER FOR USE IN PRODUCTION OF LIGHT EMITTING DIODE

[75] Inventors: Shinichi Hasegawa; Hisanori Fujita, both of Tscuhiura, Japan

[73] Assignee: Mitsubishi Monsanto Chemical Co., Tokyo, Japan

Reexamination Request:
No. 90/001,306, Aug. 10, 1987

Reexamination Certificate for:
Patent No.: 4,252,576
Issued: Feb. 24, 1981
Appl. No.: 55,377
Filed: Jul. 6, 1979

[30] Foreign Application Priority Data

Jul. 7, 1978 [JP] Japan ................. 53-82739

[51] Int. Cl.$^4$ .................. H01L 29/12; H01L 21/20
[52] U.S. Cl. .................... 148/33.4; 148/33; 148/33.5; 148/DIG. 65; 148/DIG. 67; 148/DIG. 72; 148/DIG. 119; 357/16; 357/17; 357/63; 437/126; 437/128; 437/132; 437/133; 437/905
[58] Field of Search ............... 148/DIG. 65, DIG. 67, 148/DIG. 72, DIG. 119, 33, 33.4, 33.5; 437/126, 128, 132, 133, 905; 357/16, 17, 63

[56] References Cited
U.S. PATENT DOCUMENTS 3,873,382  3/1975  Groves et al. ................. 437/128
4,218,270  8/1980  Hasegawa et al. ............. 148/175

FOREIGN PATENT DOCUMENTS 53-66388  6/1978  Japan .

OTHER PUBLICATIONS

Stringfellow et al., "Green-Emitting Diodes in Vapor Phase Epitaxial GaP", *Solid State Electronics*, 1975, vol. 18, pp. 1019–1028.
J. Electrochem. Soc., vol. 116, No. 2 (1969) 248:53.
Sol. State Elec., vol. 9 (1966) 721:6.
Herzog et al., "Electroluminescence . . . GaAsP Diodes . . . Concentration", J. Appl. Physics, vol. 40, No. 4, Mar. 15, 1969, pp. 1830–1838.
Craford et al., "LED Technology", Solid State Technology, Jan. 1974, pp. 39–46 and p. 58.

*Primary Examiner*—William G. Saba

[57] ABSTRACT

An epitaxial wafer of $GaAs_{1-x}P_x$ has been doped with nitrogen and used for the production of light emitting diode (LED). The carrier concentration of the conventional $GaAs_{1-x}P_x$ was from $3 \times 10^{16}$ to $2 \times 10^{17}/cm^3$.

According to the present invention, the carrier concentration is reduced lower than the conventional concentration and the luminance of LED is increased approximately two or three times the conventional luminance.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 6 is cancelled.

Claims 1 and 7 are determined to be patentable as amended.

Claims 2-5 and 8, dependent on an amended claim, are determined to be patentable.

New claims 9 and 10 are added and determined to be patentable.

1. In an epitaxial wafer for use in the production of a light emitting diode, comprising:
a single crystalline semiconductor substrate *having a lattice constant $l_1$, and;*
an epitaxial layer of a [compound semiconductor] *gallium arsenide phosphide having a lattice constant $l_2$, said epitaxial layer* being doped with nitrogen and having a general formula of $GaAs_{1-x}P_x$, wherein the mixed crystal ratio x ranges from 0.5 to *less than* 1.0, [an] *the* improvement comprising *(i)* providing said epitaxial layer with a concentration of carriers having one conductivity type in the range of [of] from $3.5 \times 10^{15}$ to $8.8 \times 10^{15}/cm^3$ and *(ii) providing an intermediate layer between said substrate and said epitaxial layer, said intermediate layer being a compound semiconductor having a formula $GaAs_{1-y}P_y$, wherein the lattice constant of said intermediate layer gradually increases in value within the range of from approximately the lattice constant $l_1$ of the semiconductor substrate to approximately the lattice constant $l_2$ of the epitaxial layer.*

7. An epitaxial [layer] *wafer* according to claim [6] *1*, wherein [the concentration of] *said intermediate layer has* carriers having [said one] *the same* conductivity type *as said carriers* in said epitaxial [intermediate] layer, *wherein the concentration of said intermediate layer carriers* is from $2 \times 10^{16}$ to $5 \times 10^{17}/cm^3$.

*9. An epitaxial wafer according to claim 1, wherein said mixed crystal ratio x is not more than 0.96.*

*10. An epitaxial wafer according to claim 1, 2 or 9, wherein said mixed crystal ratio x ranges from $0.74 \pm 0.08$ to $0.88 \pm 0.08$.*

* * * * *